US 7,694,650 B2

(12) United States Patent
Huang et al.

(10) Patent No.: US 7,694,650 B2
(45) Date of Patent: Apr. 13, 2010

(54) EXHAUST MONITORING CUP

(75) Inventors: Kuo-Chen Huang, Hsinchu (TW);
Chang-Shing Chen, Tainan (TW);
Hsin-Yi Ho, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 1533 days.

(21) Appl. No.: 10/235,184

(22) Filed: Sep. 4, 2002

(65) Prior Publication Data
US 2004/0040499 A1 Mar. 4, 2004

(51) Int. Cl.
*B05C 5/02* (2006.01)

(52) U.S. Cl. .......................... 118/712; 118/52; 118/319; 118/320

(58) Field of Classification Search .................... 73/200; 118/692, 52, 319, 320, 712; 427/240, 8
See application file for complete search history.

(56) References Cited

U.S. PATENT DOCUMENTS

| 5,038,608 A | * | 8/1991 | Sakai et al. ................... 73/202 |
| 6,063,198 A | * | 5/2000 | Bang et al. .................. 118/715 |
| 6,409,838 B1 | * | 6/2002 | Sakai .......................... 118/725 |
| 6,616,758 B2 | * | 9/2003 | Hung et al. .................... 118/52 |

* cited by examiner

*Primary Examiner*—Laura Edwards
(74) *Attorney, Agent, or Firm*—Tung & Associates

(57) ABSTRACT

An exhaust monitoring cup which measures exhaust gas flowing through a top opening in a coater cup of a spin coating apparatus used in the deposition of photoresist coatings on semiconductor wafers. The exhaust monitoring cup includes a gas flow cup which is positioned in fluid communication with the top opening of the coater cup. The exhaust gas flows through a gas flow opening in the gas flow cup, and a flow rate measuring apparatus at the gas flow opening receives the exhaust gas and measures the flow rate thereof. The flow rate of the gas leaving the gas flow cup can be compared to the flow rate of the gas flowing from an exhaust conduit leading from the bottom of the coater cup, to facilitate detection of abnormal conditions in the coater cup or exhaust conduit.

7 Claims, 2 Drawing Sheets

EXHAUST MONITORING CUP

BACKGROUND OF THE INVENTION

The present invention relates to coater cups for spin coating apparatuses used to coat a photoresist on a semiconductor wafer substrate in the fabrication of semiconductor integrated circuits. More particularly, the present invention relates to an exhaust monitoring cup for monitoring the flow rate of exhaust gases emitted from a coater cup during a spin coating operation.

FIELD OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

During the photolithography step of semiconductor production, light energy is applied through a reticle mask onto a photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

Spin coating of photoresist on wafers is carried out in an automated track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical conventional spin coating apparatus for coating semiconductor wafers with a photoresist liquid is generally indicated by reference numeral 8 in FIG. 1. The spin coating apparatus 8 includes a coater cup 3 which includes a top opening 6 and partially encloses a wafer support stage or chuck 1 on which is supported the wafer 2. In operation, the chuck 1 rotates the wafer 2 at high speeds, typically as high as 4,000 rpm, either after or as the liquid photoresist (not shown) is dispensed onto the center of the spinning wafer 2, through the top opening 6, by operation of a dispensing arm (not shown). By operation of centrifugal force imparted to the wafer 2 by the rotating chuck 1, the dispensed photoresist liquid is spread across and uniformly coated on the surface of the wafer 2. Exhaust solvent gases and photoresist particles generated during the process are vented from the coater cup 3 through an exhaust pipe 4 which may be connected to an exhaust manifold 5.

A flow rate measuring apparatus 9, such as, for example, a mass flowmeter, is typically operably connected to the exhaust pipe 4 beneath the coater cup 3 to measure the flow rate of the exhaust gas through the exhaust pipe 4. A reduction in the flow rate of exhaust gas through the exhaust pipe 4 may indicate a blockage, constriction or other abnormal condition in the exhaust pipe 4. However, the flow rate measuring apparatus 9 is incapable of revealing abnormal conditions inside the coater cup 3, such as, for example, excessive buildup of photoresist coatings and particles on the inside walls of the coater cup 3. Furthermore, a small blockage in the exhaust pipe 4, leading to only a modest reduction in the exhaust gas flow rate in the exhaust pipe 4, as measured by the apparatus 9, may go largely unnoticed by operating personnel in the absence of a second flow rate value against which the first value may be compared. Accordingly, a device is needed for measuring the flow rate of exhaust gas exiting the coater cup 3 through the top opening 6 thereof in order to provide an exhaust gas flow rate value which can be compared with the flow rate of exhaust gas in the exhaust pipe 4.

An object of the present invention is to provide an apparatus for measuring a rate of flow of exhaust gas from a coater cup of a spin coating apparatus for semiconductors.

Another object of the present invention is to provide an exhaust monitoring cup which receives exhaust gas flowing from a coater cup of a spin coating apparatus and directs the gas to a flow rate-measuring apparatus which measures the exhaust gas flow rate.

Still another object of the present invention is to provide an exhaust monitoring cup which can be used in conjunction with a flow rate measuring apparatus to measure the rate of flow of exhaust gas flowing from a coater cup of a spin coating apparatus and indicate abnormal conditions inside the coater cup.

A still further object of the present invention is to provide an exhaust monitoring cup which can be used to measure the flow rate of exhaust gas exiting a coater cup from a top opening therein and compare the flow rate to a second flow rate of the exhaust gas exiting the coater cup through an exhaust conduit in order to indicate the presence of abnormal conditions in the coater cup or exhaust conduit.

Still another object of the present invention is to provide an exhaust monitoring cup which is capable of use in an SVG track-type spin coating apparatus or a TEL track-type spin coating apparatus.

SUMMARY OF THE INVENTION

In accordance with these and other objects and advantages, the present invention comprises an exhaust monitoring cup which measures exhaust gas flowing through a top opening in a coater cup of a spin coating apparatus used in the deposition of photoresist coatings on semiconductor wafers. The exhaust monitoring cup includes a gas flow cup which is positioned in fluid communication with the top opening of the coater cup. The exhaust gas flows through a gas flow opening in the gas flow cup, and a flow rate measuring apparatus at the gas flow opening receives the exhaust gas and measures the flow rate thereof. The flow rate of the gas leaving the gas flow cup can be compared to the flow rate of the gas flowing from an exhaust conduit leading from the bottom of the coater cup, to facilitate detection of abnormal conditions in the coater cup or exhaust conduit.

BRIEF DESCRIPTION OF THE DRAWINGS

The invention will be described, by way of example, with reference to the accompanying drawings, in which.

DESCRIPTION OF THE PREFERRED EMBODIMENTS

Figure 4:
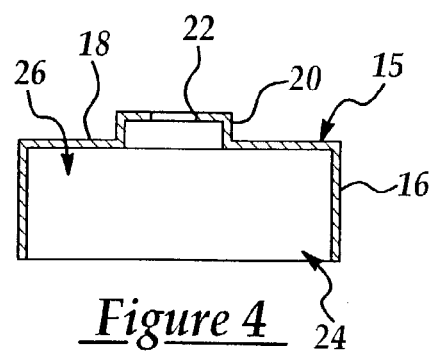
FIG. 4 is a sectional view, taken along section lines 4-4 in FIG. 3, of the gas flow cup element of the exhaust monitoring cup of the present invention.
Figure 4A:
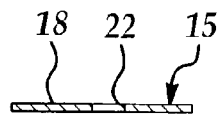
FIG. 4A illustrates an alternative position for a gas flow opening in the gas flow cup.

An illustrative embodiment of the exhaust monitoring cup of the present invention is generally indicated by reference numeral 14 and is designed to measure the flow rate of exhaust gases, particularly solvent or other process fluid gases, exiting a top opening 12 in a coater cup 10 of a spin coating apparatus 34, during a photoresist application process carried out in the coater cup 10 as hereinafter described. The spin coating apparatus 34 may be, for example, a TEL (Tokyo Electron limited) track type apparatus or an SVG (Silicon Valley Group) track type apparatus. The exhaust monitoring cup 14 includes a gas flow cup 15, having a typically cylindrical cup wall 16 which defines a cup interior 26, as shown in FIG. 4. The gas flow cup 15 has a bottom cup opening 24, and a cup top 18 is provided on the cup wall 16 opposite the bottom cup opening 24. A cup extension 20 may extend from the cup top 18, in which case a central gas flow opening 22 extends through the top portion of the cup extension 20 and establishes communication between the cup interior 26 and the exterior of the gas flow cup 15. Alternatively, the cup extension 20 may be omitted from the gas flow cup 15, in which case the gas flow opening 22 extends through the cup top 18, typically in approximately the center thereof, as illustrated in FIG. 4A.

Figure 1:
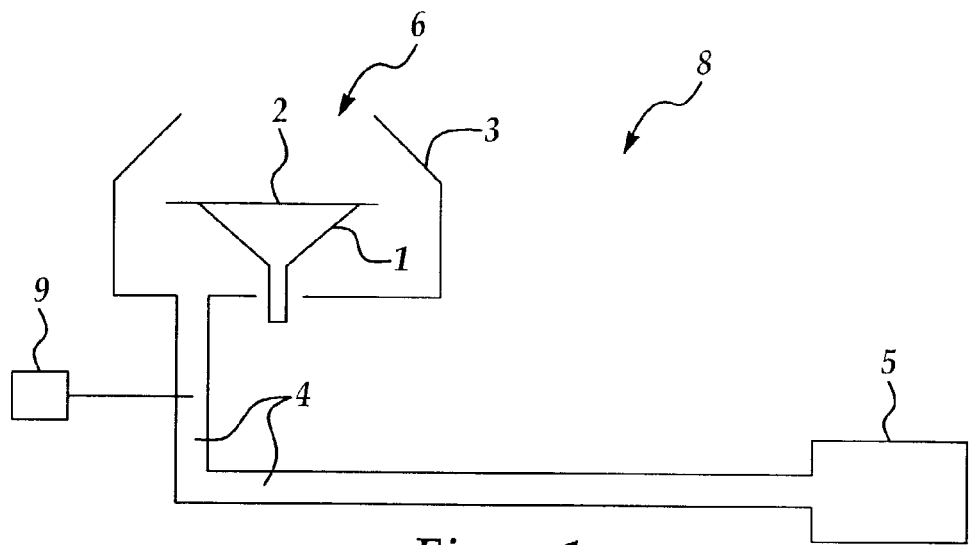
FIG. 1 is a schematic view of a typical conventional spin coating apparatus for the processing of semiconductors.
Figure 2:
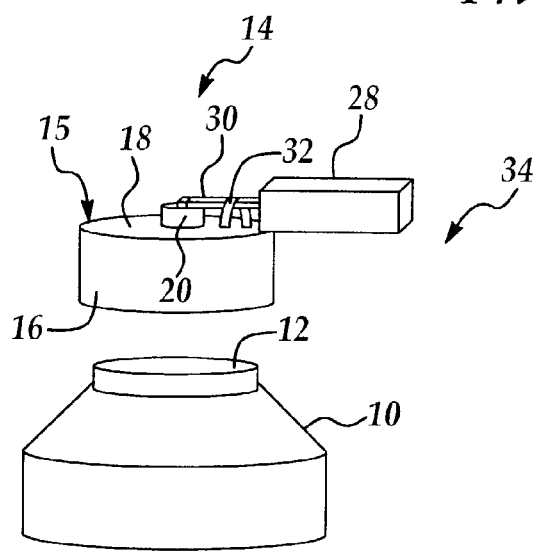
FIG. 2 is an exploded, perspective view of an illustrative embodiment of the exhaust monitoring cup of the present invention, with a coater cup of a spin coating apparatus disposed beneath the exhaust monitoring cup.
Figure 3:
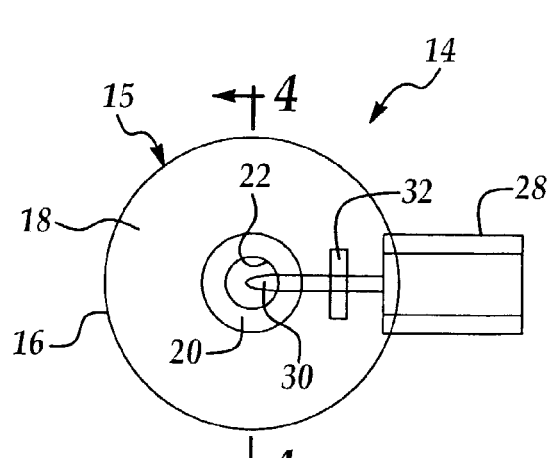
FIG. 3 is a top view of the exhaust monitoring cup illustrated in FIG. 2.
Figure 5:
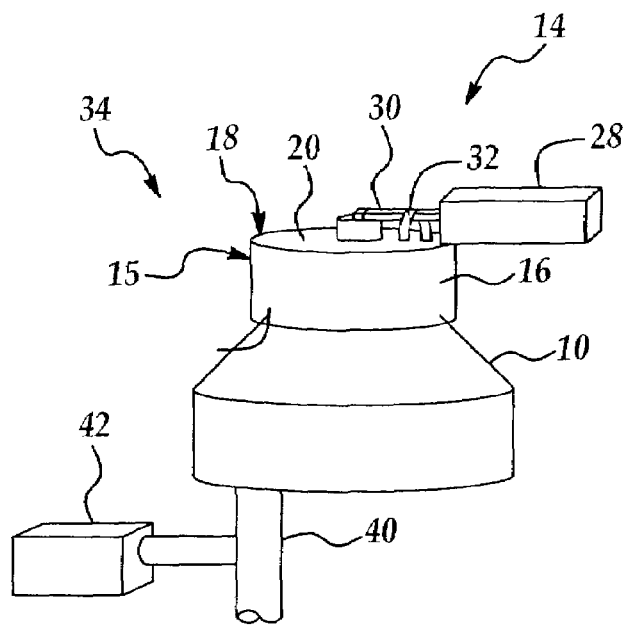
FIG. 5 is a perspective view of a spin coating apparatus in implementation of the present invention.
Figure 6:
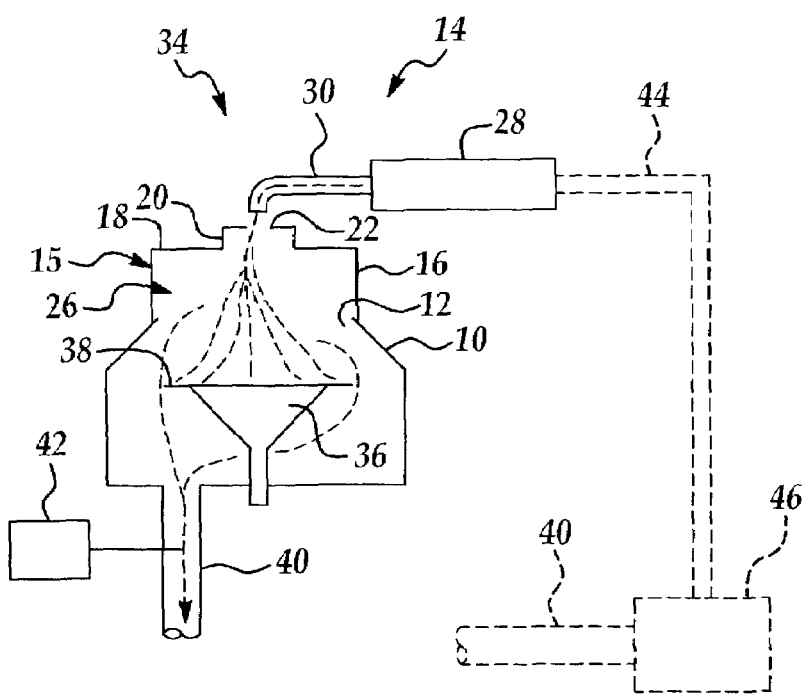
FIG. 6 is a schematic view illustrating operation of a spin coating apparatus in implementation of the present invention.

The inlet end of an air tube 30 is disposed directly above the gas flow opening 22 of the gas flow cup 15, as shown in FIG. 3. The opposite end of the air tube 30 is confluently connected, according to the knowledge of those skilled in the art, to a flow rate measuring apparatus 28, which may be a mass flowmeter, for example. A suitable fastener or fasteners 32 may be used to secure the air tube 30 on the cup top 18 of the gas flow cup 15. In use of the exhaust monitoring cup 14, as hereinafter described, the gas flow cup 15 is positioned against or in close proximity to the coater cup 10, as shown in FIG. 5, such that the bottom cup opening 24 (FIG. 4) of the gas flow cup 15 is disposed in fluid communication with the top opening 12 of the coater cup 10, as shown in FIG. 6. Accordingly, the air tube 30 is configured for receiving exhaust gases flowing upwardly from the coater cup 10 into the gas flow cup 15 and from the gas flow cup 15 through the gas flow opening 22 thereof. The exhaust gases flow from the air tube 30 into the flow-rate measuring apparatus 28, which measures the rate of flow of the exhaust gases from the gas flow opening 22 of the gas flow cup 15.

Referring next to FIGS. 5 and 6, the exhaust monitoring cup 14 of the present invention is used in conjunction with a spin coating apparatus 34 to monitor the flow rate of exhaust gases flowing from the coater cup 10 through the top opening 12 thereof during a process for spin-coating a semiconductor wafer 38 with a photoresist liquid in the coater cup 10. A primary exhaust conduit 40 extends from the coater cup 10 of the spin coating apparatus 34 for conveying exhaust gases from the coater cup 10 during the photoresist deposition process. A flow-rate measuring apparatus 42, such as a mass flowmeter, is operably connected to the primary exhaust conduit 40 for measuring the flow rate of exhaust gas in the primary exhaust conduit 40. The coater cup 10, primary exhaust conduit 40 and flow rate measuring apparatus 42 may be conventional components of the spin coating apparatus 34. Accordingly, in a typical spin-coating process, the wafer 38 is spun on a wafer stage or chuck 36 inside the coater cup 10 at speeds of up to typically about 4000 rpm. Simultaneously, a supply of photoresist liquid (not shown) is dispensed from a dispensing arm (not shown) onto the center of the spinning wafer 38. Alternatively, the photoresist liquid may be dispensed onto the wafer 38 prior to rotating the wafer 38. As the wafer 38 rotates, centrifugal force acts on the photoresist liquid and spreads the liquid from the center toward the edges of the wafer 38, thereby uniformly coating the upper surface of the wafer 38. Simultaneously, exhaust gases and particles are generated from the photoresist liquid and these tend to flow from the coater cup 10, both downwardly through the primary exhaust conduit 40 and upwardly through the top opening 12 in the coater cup 10, the cup interior 26 and gas flow opening 22 of the gas flow cup 15, the air tube 30, and into the flow rate measuring apparatus 28, respectively, as indicated by the dashed lines in FIG. 6. The flow rate measuring apparatus 42 measures the flow rate of exhaust gases flowing through the primary exhaust conduit 40, whereas the flow rate measuring apparatus 28 measures the flow rate of exhaust gases flowing from the gas flow opening 22 of the gas flow cup 15. As illustrated in FIG. 6, exhaust gases flowing from the bottom of the coater cup 10 through the primary exhaust conduit 40 may be distributed to an exhaust manifold 46. Exhaust gases flowing through the flow rate measuring apparatus 28 from the gas flow cup 15 may be distributed to the exhaust manifold 46 through a secondary exhaust conduit 44.

Under normal conditions in which the coater cup 10 and primary exhaust conduit 40 are substantially devoid of photoresist particles or deposits which would otherwise hinder the free flow of exhaust gas from the coater cup 10 through both the top opening 12 thereof and through the primary exhaust conduit 40, the flow rate of the exhaust gases as measured by the apparatus 28 of the exhaust monitoring cup 14 and the flow rate of the exhaust gases as measured by the apparatus 42 in the primary exhaust conduit 40 are substantially the same. However, a lower gas flow rate measured by the flow rate measuring apparatus 42 of the primary exhaust conduit 40, as compared to that measured by the flow rate measuring apparatus 28 of the exhaust monitoring cup 14, may indicate an abnormal condition in the primary exhaust conduit 40, such as a buildup of photoresist or accumulation of photoresist particles partially or completely obstructing the primary exhaust conduit 40, for example. Measures may then be taken to remove the obstruction or obstructions from the primary exhaust conduit 40. On the other hand, a lower gas flow rate measured by the flow rate measuring apparatus 28 of the spin coating apparatus 34, as compared to that measured by the flow rate measuring apparatus 42 of the primary exhaust conduit 40, may indicate an abnormal condition in the coater cup 10, such as an excessive buildup of photoresist or accumulation of photoresist particles on inside surfaces and/or components of the coater cup 12, for example. Measures may then be taken to remove the photoresist or photoresist particles from the interior surfaces or components of the coater cup 12.

While the preferred embodiments of the invention have been described above, it will be recognized and understood that various modifications can be made in the invention and the appended claims are intended to cover all such modifications which may fall within the spirit and scope of the invention.

What is claimed is:

1. A spin coating apparatus for coating a semiconductor wafer substrate with a photoresist, said spin coating apparatus adapted to measure a flow rate of a gas during a spin coating process, said spin coating apparatus comprising:
   a spin coating apparatus cup disposed to surround said semiconductor wafer, said during said spin coating process, said spin coating apparatus cup comprising an opened top, said opened top comprising an opening extending upward through a top covering portion of said spin coating apparatus cup;
   an exhaust monitoring cup comprising a gas flow cup, said gas flow cup having an intake opening, said intake opening disposed above said opened top to receive the gas emanating upward from the spin coating apparatus coater cup;
   a cup extension carried by said gas flow cup and wherein said gas flow opening is provided in said cup extension;
   a first flow rate measuring apparatus disposed in fluid communication with said gas flow opening, said flow rate measuring apparatus disposed to receive and measure the flow rate of the gas from said gas flow opening
   an air tube having an inlet end disposed adjacent to said gas flow opening and an outlet end spaced from said inlet end and wherein said first flow rate measuring apparatus engages said outlet end;
   a second flow rate measuring apparatus disposed in fluid communication with an exhaust conduit, said exhaust conduit disposed to receive a remaining portion of said gas from said coater cup not received by said gas flow cup; and
   a secondary gas exhaust conduit disposed to receive the gas from said first flow rate measuring apparatus wherein said secondary gas exhaust conduit and said exhaust conduit are in fluid communication with a common exhaust manifold.

2. The spin coating apparatus of claim 1 wherein said gas flow cup comprises a cylindrical cup wall and a cup top carried by said cup wall in spaced-apart relationship to said intake opening.

3. The spin coating apparatus of claim 1 wherein each said flow rate measuring apparatus comprises a mass flowmeter.

4. The spin coating apparatus of claim 3 wherein said mass flowmeter engages said outlet end.

5. A spin coating apparatus for coating a semiconductor water substrate with a photoresist, said spin coating apparatus adapted to measure a flow rate of a gas during a spin coating process, said spin coating apparatus comprising:
   a spin coating apparatus cup disposed to surround said semiconductor wafer, said semiconductor wafer rotating inside said spin coating apparatus cup during said spin coating process, said spin coating apparatus cup comprising an opened top, said opened top comprising an opening extending upward through a top covering portion of said spin coating apparatus cup;
   an exhaust monitoring cup, said exhaust monitoring cup comprising a gas flow cup, said gas flow cup having a generally cylindrical cup housing, an intake opening provided at a first end of said cup housing for receiving the gas from the spin coating apparatus coater cup, said intake opening disposed above said opened top to receive the gas emanating upward from the spin coating apparatus coater cup;
   a cup extension carried by said gas flow cup and wherein said gas flow opening is provided in said cup extension;
   a first flow rate measuring apparatus disposed in fluid communication with said gas flow opening, said flow rate measuring apparatus disposed to receive and measure the flow rate of the gas from said gas flow opening
   an air tube having an inlet end disposed adjacent to said gas flow opening and an outlet end spaced from said inlet end and wherein said first flow rate measuring apparatus engages said outlet end;
   a second flow rate measuring apparatus disposed in fluid communication with an exhaust conduit, said exhaust conduit disposed to receive a remaining portion of said gas from said coater cup not received by said gas flow cup; and
   a secondary gas exhaust conduit disposed to receive the gas from said first flow rate measuring apparatus wherein said secondary gas exhaust conduit and said exhaust conduit are in fluid communication with a common exhaust manifold.

6. The spin coating apparatus of claim 5 wherein each said flow rate measuring apparatus engages said outlet end.

7. The spin coating apparatus of claim 5 wherein each said flow rate measuring apparatus comprises a mass flowmeter.

* * * * *